(12) United States Patent
Miller et al.

(10) Patent No.: US 7,960,657 B2
(45) Date of Patent: Jun. 14, 2011

(54) ELECTRICAL DEVICE

(75) Inventors: Hans-Peter Miller, Rosmarinweg (DE);
Andreas Doeffinger, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 256 days.

(21) Appl. No.: 11/161,855

(22) Filed: Aug. 19, 2005

(65) Prior Publication Data

US 2006/0037771 A1 Feb. 23, 2006

(30) Foreign Application Priority Data

Aug. 21, 2004 (DE) .......................... 10 2004 040 592

(51) Int. Cl.
*H01L 23/49* (2006.01)
*H05K 5/06* (2006.01)

(52) U.S. Cl. .................................. 174/538; 174/138 G

(58) Field of Classification Search .................. 174/52.1, 174/50, 65 R, 68.1, 59, 60, 6, 538, 138 G; 361/752, 728; 257/672, 691, 712, 713
See application file for complete search history.

(56) References Cited

U.S. PATENT DOCUMENTS

| | | | |
|---|---|---|---|
| 3,091,734 A | 5/1963 | Graves | |
| 4,145,565 A | 3/1979 | Donon | |
| 4,885,662 A * | 12/1989 | Bartholomew et al. | 361/716 |
| 5,229,922 A | 7/1993 | Muramatsu et al. | |
| 5,255,159 A | 10/1993 | Seyk | |
| 6,064,002 A * | 5/2000 | Hayami et al. | 174/52.1 |
| 6,556,447 B2 * | 4/2003 | Cudini et al. | 361/752 |
| 6,646,884 B1 | 11/2003 | Frisch et al. | |
| 6,750,551 B1 * | 6/2004 | Frutschy et al. | 257/785 |
| 6,852,927 B2 * | 2/2005 | Fukushima | 174/551 |
| 2004/0062491 A1 * | 4/2004 | Sato et al. | 385/88 |

FOREIGN PATENT DOCUMENTS

| | | |
|---|---|---|
| DE | 3629552 | 3/1988 |
| DE | 199 24 993 | 12/2000 |
| DE | 102 26 766 | 1/2004 |

* cited by examiner

*Primary Examiner* — Hung V Ngo
(74) *Attorney, Agent, or Firm* — Michael J. Striker

(57) ABSTRACT

An electrical device has a housing and a housing surface, at least one electrical conductor accommodated in said housing and interrupting said housing surface in sections so that said housing surface is interrupted, a conductive body which covers said conductor on said interrupted housing surface, and at least two spacers which keep said conductive body apart from said at least one conductor.

14 Claims, 2 Drawing Sheets

ELECTRICAL DEVICE

CROSS-REFERENCE

The invention described and claimed hereinbelow is also described in DE 10 2004 040592.1, filed Aug. 21, 2004. This German Patent Application, whose subject matter is incorporated here by reference, provides the basis for a claim of priority of invention under 35 U.S.C. 119 (a)-(d).

BACKGROUND OF THE INVENTION

The present invention relates to an electrical device with a housing and a housing surface, the housing surface being interrupted in sections by at least one electrical conductor accommodated in the housing.

Known electrical devices of this kind are comprised of a housing into which a cooling body made of diecast aluminum is integrated. The integration is achieved by inserting the diecast cooling body into an injection mold and then partially molding the cooling body into the injection molding plastic. This partial molding produces a relatively secure, sealed connection between the cooling body and the hardened plastic housing. The housing contains other insert parts, so-called blanking skeletons, which function as conductor tracks in the housing. These conductor tracks end far enough away from an opening provided in the plastic housing that the entire opening has a closed, rectangular plastic rim. A pedestal of the cooling body protrudes into this opening and supports a substrate support or LBS. The substrate on the substrate support contacts the above-mentioned conductor tracks by means of bonding wires. In this embodiment, it is disadvantageous that the above-mentioned relatively wide plastic frame prevents a more compact design of the electrical device.

SUMMARY OF THE INVENTION

Accordingly, it is an object of the present invention to provide an electrical device which avoids the disadvantages of the prior art.

In keeping with these objects and with others which will become apparent hereinafter, one feature of the present invention resides, briefly stated, in an electrical device, comprising a housing and a housing surface; at least one electrical conductive accommodated in said housing and interrupting said housing surface in sections so that said housing surface is interrupted; a conductor body which covers said conductor on said interrupted housing surface; and at least two spacers which keep said conductive body apart from said at least one conductor.

The electrical device according to the present invention has the advantage that providing at least two spacers between the at least one electrical conductor and another conductive body can reliably prevent short-circuiting between the conductive body and the conductor. In addition, this type of design permits further miniaturization of the electrical device.

If the at least one conductor is permitted to protrude from the housing in a circumference surface of an opening and the conductive body is inserted into the opening, then on the one hand, with an intrinsically uninsulated end of the conductor, it is possible to achieve the shortest possible short-circuit-free spacings between the conductor and the conductive body. In addition, this type of design of the at least one conductor makes it possible to shorten the conductor in the opening to a required dimension.

Before the conductive body is inserted into the opening, the conductors surrounding the opening can, for example, still be connected to one another by a shared middle part that is cut, for example, from the opening by means of a stamping process. The fact that the conductors are initially connected to one another by a middle part also has advantages with regard to the manufacturing process of the housing since the conductors are thus easily held in place despite the high pressures that occur during the injection molding of the housing. This improves the quality of the conductor arrangement.

The novel features which are considered as characteristic for the present invention are set forth in particular in the appended claims. the invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
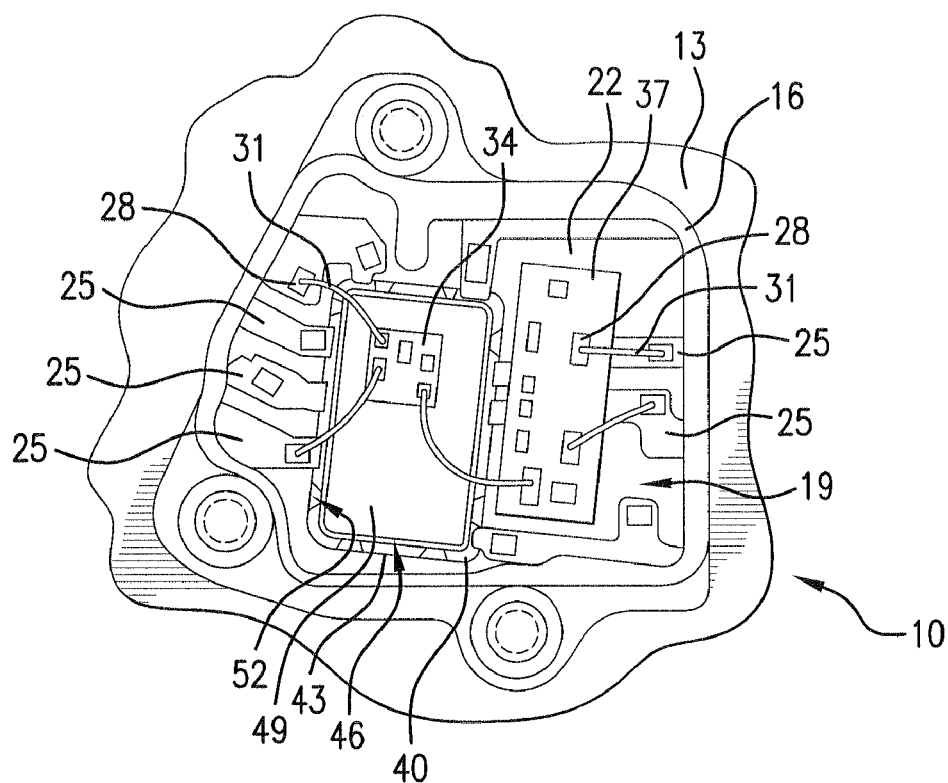
FIG. 1 is a top view of the open housing in accordance with the present invention.

FIG. 1 is a top view of the electrical device 10. Part of a housing 13 is shown, which has a wall 16 that delimits a housing interior 19. The bottom 20 of the housing interior 19 is delimited by a housing bottom surface 22. The housing bottom surface 22 is constituted in large part by a plastic surface of the plastic housing. But sections of the housing bottom surface 22 are interrupted by one or more electrical conductors 25 accommodated in the housing 13. The conductors 25 are so-called insert parts that are inserted into the injection mold before the housing 13 is actually injection molded and are then at least partially molded into the plastic material of the housing 13. The surfaces of the conductors 25 are provided with so-called bond pads 28 that serve to electrically connect the conductors to a first substrate of 34 by means of so-called bonding wires 31. In this example, these bonding wires 31 also produce an electrical contact with an optional second substrate.

The housing interior 19 is provided with not only the housing opening delimited by the wall 16 but also a bottom opening 40, which is essentially rectangular in the example and is essentially closed by a pedestal 43 of a cooling body 46. The cooling body 46 rests against the rear of the housing 13, not shown here, over a large area and in a tightly sealed fashion. In this exemplary embodiment, the pedestal 43 supports a substrate support 49, which can be embodied for example as an LBS. This substrate support 49 supports the first substrate 34. The bottom opening 40 has a circumference surface 52, which is oriented toward the substrate support 49 in the example.

Figure 2:
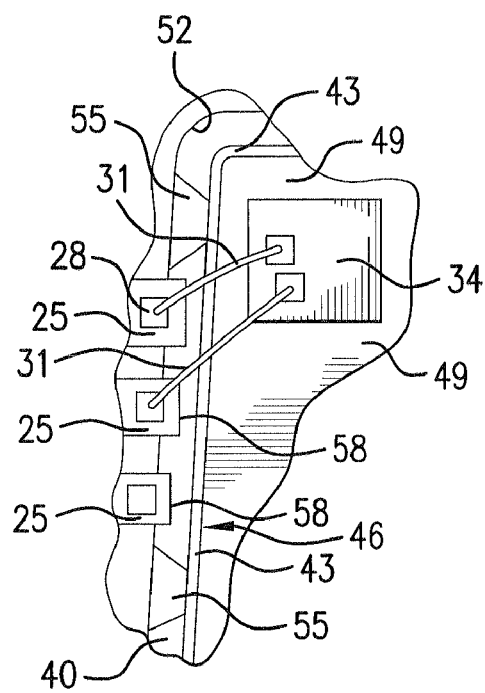
FIG. 2 is a detailed view of the joint between the housing and the pedestal in accordance with the present invention.

As is clear from the enlarged depiction in FIG. 2, in the example, three conductors 25 protrude beyond the circumference surface 52 into a gap between the circumference surface 52 and the cooling body 46 and without special steps being taken, could contact the pedestal 43 or the substrate support 49 if they were positioned imprecisely. Since both the pedestal 43 and the substrate support 49 are electrically conductive because they are metallic and since they are also electrically connected, for example, to ground or to a different potential, the problem could arise that one or more adjacent conductors 25 protruding into the opening 40 would be short-circuited by means of the pedestal 43 or the substrate support 49 or would come into contact with a different, impermissible potential. Under certain circumstances, this would, for example, prevent the circuit situated on the first substrate 34 from functioning. For this reason, the conductive body, whether it is the pedestal 43 or the substrate support 49, is kept spaced apart from the at least one conductor 25 by means of at least two spacers 55.

In the exemplary embodiment according to FIG. 1, a total of eight spacers 55—two on each side of the rectangular opening 40—prevent short-circuits between the conductors 25 and the pedestal 43 and/or substrate support 49 to which the substrate 34, for example an electronic controller unit, is fastened. The spacers 55 in the opening 40 preferably have a height of 0.3 to 0.5 mm.

The present invention thus provides an electrical device 10 having a housing 13 and a housing surface 22, 52, where the housing surface 22, 52 is interrupted in sections by at least one electrical conductor 25 accommodated in the housing 13 and on the interrupted housing surface 22, 52, the at least one conductor is covered by a conductive body 43, 46 and the conductive body 43, 46 is kept spaced apart from the conductor 25 by means of at least two spacers 55.

According to one embodiment of the present invention, the at least two spacers are integrally joined to the housing 13.

According to another embodiment of the present invention, the at least one conductor 25 protrudes from the circumference surface 52 of the opening 40 and the conductive body, whether it is the substrate support 49 or the cooling body 46 with its pedestal 43, is in situated in the opening 40.

As has already been explained, it is immaterial to the function of the spacers 55 whether the conductive body is a pedestal 43 of a cooling body 46 or is another conductive body attached to the pedestal, for example the substrate support 49.

The conductors 25 shown in FIG. 2 protrude into the opening 40, among other reasons because these conductors 25 in the opening 40 are shortened to the length shown therein by means of a stamping process. The stamped edges 58 of the conductors 25 consequently protrude into the opening 40.

Figure 3:
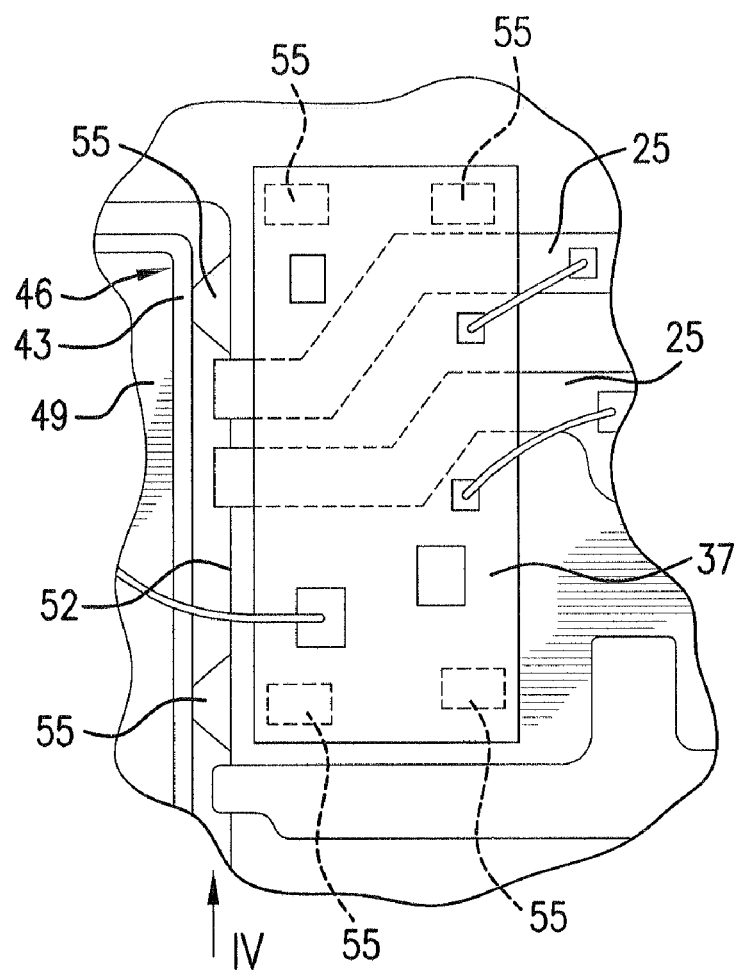
FIG. 3 is a detailed view of a second substrate that spans two conductors in accordance with the present invention.

FIG. 3 is an enlarged top view of the second substrate 37. As is clear from this depiction, two conductors 25 cross under the conductive body in the form of the second substrate 37. In order to prevent the conductive body, i.e. the substrate 37, from touching the two conductors 25 or the at least one conductor 25, in this exemplary embodiment, a total of four spacers 55 are provided so that the substrate 37 is situated well above the conductor 25 or conductors 25. The substrate 37 can be attached at the provided location by means of an adhesive, for example. Since the two conductors 25 shown in FIG. 3 likewise protrude from the circumference surface 52 into the opening 40, this side of the opening 40 must also be provided with two spacers 55 so that the pedestal 43 or the substrate support 49 cannot contact the two conductors 25 and cause a short-circuit.

Figure 4:
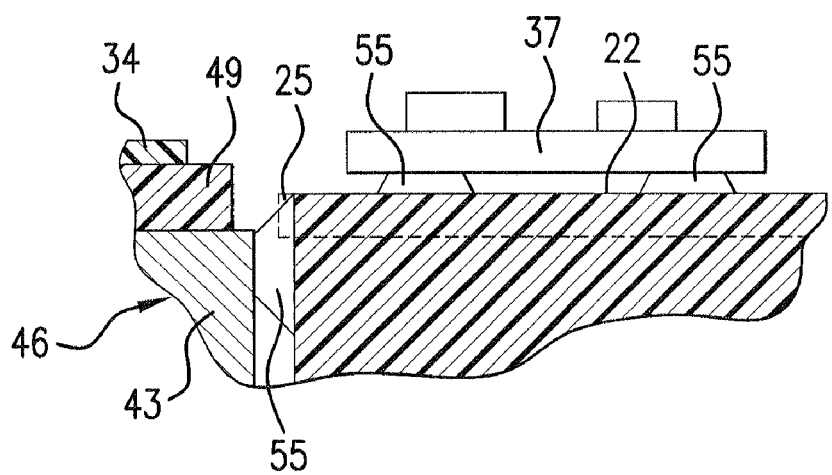
FIG. 4 shows a section through the above-mentioned joint in accordance with the present invention.

FIG. 4 shows a sectional view analogous to the one depicted in FIG. 3. FIG. 4 shows the effect the spacers achieve by preventing the conductors 25 from contacting the pedestal 43 of the cooling body 46 or a possibly lower-slung substrate support 49. It is also clear here how the spacers 55 protruding from the housing surface 22 support the second substrate 37 and thus reliably prevent a short-circuit or other electrical connection with at least one conductor 25 underneath the second substrate 37. But this type of arrangement of the second substrate 37 shown in FIG. 4 also assures an insulating, virtually stress-free mechanical attachment of the second substrate 37, for example embodied in the form of an LTCC, to the plastic housing, in particular, to the bottom housing surface 22. A dimension of between 0.075 mm and 0.4 mm has turned out to be a suitable height for these spacers 55 situated underneath the second substrate. For example, these spacers 55 can be embodied in the form of cylinders or truncated cones, but they can also be embodied in other shapes.

When there are at least two conductors 25 in the opening 40, the spacers 55 also prevent a contact between the at least two conductors 25. This is also true for at least two conductors 25 underneath the second substrate 37.

According to another embodiment of the present invention, the electrical device 10 is embodied as a controller of a three-phase alternator for motor vehicles.

It will be understood that each of the elements described above, or two or more together, may also find a useful application in other types of constructions differing from the types described above.

While the invention has been illustrated and described as embodied in an electrical device, it is not intended to be limited to the details shown, since various modifications and structural changes may be made without departing in any way from the spirit of the present invention.

Without further analysis, the foregoing will reveal fully reveal the gist of the present invention that others can, by applying current knowledge, readily adapt it for various applications without omitting features that, from the standpoint of prior art, fairly constitute essential characteristics of the generic or specific aspects of the invention.

What is claimed as new and desired to be protected by Letters Patent is set forth in the appended claims:

1. An electrical device, comprising a housing, wherein said housing has a housing bottom, wherein the housing bottom has a housing bottom surface; at least one electrical conductor accommodated in said housing and interrupting said housing bottom in sections so that said housing bottom surface is interrupted; a conductor body, wherein said conductor body is configured to said conductor on said interrupted housing bottom surface; and at least two spacers which keeps said conductor body apart from said at least one conductor, wherein said at least two spacers are integrally formed with said housing.

2. An electrical device as defined in claim 1, wherein the conductor body is a substrate.

3. An electrical device as defined in claim 2, wherein the substrate is attached with an adhesive to the housing surface bottom.

4. An electrical device as defined in claim 2, wherein said substrate is electrically connected to said at least one electrical conductor by a bonding wire.

5. An electrical device as defined in claim 1, wherein the at least two spacers have a height that is between 0.075 mm and 0.4 mm.

6. An electrical device, comprising a housing, wherein said housing has a bottom, wherein the housing bottom has a housing bottom surface; at least one electrical conductor accommodated in said housing and interrupting said housing bottom in sections so that said housing bottom surface is interrupted; and a conductor body, wherein said housing bottom has an opening with a circumferential surface, said at least one electrical conductor protruding from said circumferential surface of said opening of said housing bottom, while said conductor is positioned in said opening, wherein the conductor body is kept spaced apart from the at least one electrical conductor by means of at least two spacers, wherein said at least two spacers are integrally formed with said housing.

7. An electrical device as defined in claim 6, wherein said conductor body is a pedestal of a cooling body.

8. An electrical device as defined in claim 6, wherein said conductor body is attached to a pedestal of a cooling body.

9. An electrical device as defined in claim 8, wherein the conductor body is a substrate support in the form on an LBS.

10. An electrical device as defined in claim 6, wherein said at least one electrical conductor has stamped edges and protrudes with said stamped edges into said opening.

11. An electrical device as defined in claim 10, wherein the at least one electrical conductor extends with the stamped edges between two spacers into the opening.

12. An electrical device as defined in claim 6, wherein the at least two spacers have a height between 0.3 mm and 0.5 mm.

13. An electrical device as defined in claim 6, wherein the opening is rectangular, and wherein two spacers are positioned on each side of said rectangular opening.

14. An electrical device as defined in claim 6, wherein eight spacers are provided.

* * * * *